(12) United States Patent
Behammer

(10) Patent No.: US 6,884,690 B2
(45) Date of Patent: Apr. 26, 2005

(54) THIN-FILM RESISTOR WITH HIGH TEMPERATURE COEFFICIENT FOR USE AS PASSIVE SEMICONDUCTOR COMPONENT FOR INTEGRATED CIRCUITS, AND METHOD FOR PRODUCING THE SAME

(75) Inventor: Dag Behammer, Ulm (DE)

(73) Assignee: DaimlerChrysler, Stuttgart (DE)

( * ) Notice: Subject to any disclaimer, the term of this patent is extended or adjusted under 35 U.S.C. 154(b) by 158 days.

(21) Appl. No.: 10/168,184

(22) PCT Filed: Dec. 5, 2000

(86) PCT No.: PCT/DE00/04320

§ 371 (c)(1),
(2), (4) Date: Jun. 18, 2002

(87) PCT Pub. No.: WO01/45151

PCT Pub. Date: Jun. 21, 2001

(65) Prior Publication Data

US 2002/0192853 A1 Dec. 19, 2002

(30) Foreign Application Priority Data

Dec. 18, 1999 (DE) ......... 199 61 180

(51) Int. Cl.⁷ ............................................. H01L 21/20
(52) U.S. Cl. ............. 438/384; 250/332; 250/338.2
(58) Field of Search .......... 438/384; 250/338.4, 250/332

(56) References Cited

U.S. PATENT DOCUMENTS

| | | | |
|---|---|---|---|
| 4,760,369 A | | 7/1988 | Tiku |
| 5,635,893 A | * | 6/1997 | Spraggins et al. .......... 338/48 |
| 5,640,013 A | * | 6/1997 | Ishikawa et al. ........ 250/338.4 |
| 6,013,935 A | * | 1/2000 | Shie .......................... 257/469 |
| 6,191,420 B1 | * | 2/2001 | Souma ..................... 250/338.1 |
| 6,329,655 B1 | * | 12/2001 | Jack et al. ............... 250/338.1 |
| 6,329,696 B1 | * | 12/2001 | Tanaka ...................... 257/419 |
| 2002/0132491 A1 | * | 9/2002 | Lang .......................... 438/745 |

FOREIGN PATENT DOCUMENTS

| | | | |
|---|---|---|---|
| EP | 0 354 369 | 2/1990 | .......... G01J/5/20 |
| EP | 0 848 427 | 6/1998 | .......... H01L/27/06 |
| JP | 63-261703 | 10/1988 | .......... H01C/17/12 |
| JP | 11273907 | 10/1999 | .......... H01C/7/02 |

\* cited by examiner

Primary Examiner—George Fourson
Assistant Examiner—Fernando L. Toledo
(74) Attorney, Agent, or Firm—Pendorf & Cutliff

(57) ABSTRACT

The invention relates to a semiconductor component with a WSiN layer as thin-film resistor with high temperature coefficient for use as thermistor in bolometers. The production method comprises thermal decoupling by means of thermistors that are free-standing or disposed on an insulation layer.

16 Claims, 5 Drawing Sheets a)

b)

c)

d)

e)

f)

g)

h)

a)

b)

c)

d)

e)

THIN-FILM RESISTOR WITH HIGH TEMPERATURE COEFFICIENT FOR USE AS PASSIVE SEMICONDUCTOR COMPONENT FOR INTEGRATED CIRCUITS, AND METHOD FOR PRODUCING THE SAME

BACKGROUND OF THE INVENTION

1. Field of the Invention

The invention is concerned with a layer sequence of a semiconductor component, a passive semiconductor component and a method for manufacture.

2. Description of the Related Art

The invention is concerned with a thermistor as a semiconductor component, for example, in bolometers. Polysilicon layers are conventionally employed as thermistors. Therein the temperature sensitivity of the resistance, the so-called TCR-value, can be adjusted over a range by doping of the polysilicon.

From U.S. Pat. No. 5,260,225 a process is known for producing an integrated, infrared sensitive bolometer employing doped polysilicon with a TCR-value of between 1–2%/° C. The doping material is selected from arsenic, phosphorous and boron. The IR sensitive polysilicon layer is provided on a thermally insulated silicon oxide layer, which serves to inhibit temperature transmission to the substrate.

Likewise, a device useful as a bolometer array is known from EP 0 354 369, which is coupled to an integrated circuit with a boron doped amorphous SiH resistor.

From U.S. Pat. No. 5,440,174 the use of WSiN-layers as resistors and diffusion barriers in integrated circuits is known. By adjusting the nitrogen content of these layers it is possible to adjust both the resistance value as well as the diffusion inhibiting effect with regard to oxygen in a targeted manner.

Likewise the use of WSiN-layers in MESFETs are know from Tabatabaie, K (1995); IEEE Transactions on Electron Devices, Vol. 42, No. 7, pp. 1205. The preferred use of these layers is likewise concerned with the diffusion inhibiting effect in combination with tempering processing during the production of GaAs-components.

No publications have until now disclosed in WSiN-layers the thermal characteristics depending upon the chemical composition of the layers, and in particular, with regard to the relationship between the TCR-value and nitrogen content.

SUMMARY OF THE INVENTION

The invention is concerned with the task of providing a layer sequence or structure and a therewith associated passive semiconductor component with high TCR and low 1/f-noise, which can be produced in integrated semiconductor construction techniques.

The invention with regard to the layer sequence is set forth in the characterizing portion of Patent claim 1, with regard to the passive semiconductor component is set forth in the characteristics of claims 4 and 5, and with regard to the process for manufacture is set forth in the characteristic portion of Patent claim 13. The remaining claims concern advantageous embodiments and further developments of the invention.

The invention concerns a layer sequence of a thin layer resistor with high temperature coefficient on a substrate. It is comprised of first passivating layer, a WSiN-layer responsible for the temperature dependent electrical resistance, and a first metalizing layer.

Preferably, between the first passivating layer and the WSiN-layer, there is an intermediate layer for thermal insulation. The intermediate sequence layer is comprised of a polymide or BCB-layer (benzocyclobutene), which may be separately etched on substrates or bonding layers.

As the WSiN-layer material, in connection with the present invention, a substantially amorphous material is described, which in its chemical composition has a variable elemental content $W_xSi_yN_z$ with x, y as main components and with incorporation of a small proportion of z. With this WSIN a material, which has until now not been used for this purpose, is employed, which exhibits a remarkably low 1/f-noise also at higher TCRs, for example greater than 1%/° C. Besides this, the WSiN exhibits an absorption in the infrared radiation range, whereby a preferred use is in bolometers. Besides this, this material can be removed or etched from almost all substrate materials by a low temperature process.

The passive semiconductor component, structured in a layer sequence, is comprised of a WSiN-residual layer which is employed as the thermistor of the inventive layer sequence. Between the electrical connections there is an opening for passage-through of the electromagnetic radiation to the thermal sensitive WSiN-Rest layer.

Below this opening there is also to be provided a second, radiation transmissive, passivating layer.

For thermal insulation, an intermediate layer sequence is preferably provided between the substrate and WSiN-layer, which prevents a conductance of heat into the substrate. This intermediate layer sequence for thermal insulation is only provided locally in the area of the radiation effect. The substrate itself can be comprised of a material with low thermal conductivity, for example, glass. In the employment of silicon, preferably insulation layers of greater thickness are employed and the silicon is separated or spaced apart below the thermistor.

For an application in the infrared range, the second passivating layer is correspondingly adapted for transmissivity for this type of electromagnetic radiation.

Besides the employment of intermediate layer sequences as insulation layers, thermal insulation is preferably achieved in the area of the opening for the passage-through of irradiation in the manner that the substrate, from the bottom side to the first passivating layer, is electrochemically etched or removed.

A thermal decoupling of the substrate occurs either by etching the carrier material or by use of a layer with low thermal conductivity.

The process for producing a passive semiconductor component is comprised in a sequence of process steps:

- a first passivating layer is deposited on a substrate,
- on the first passivating layer a WSiN-layer and a first metal layer are deposited over the entire surface,
- the first metal layer is structured into a first connection metallization (metallization),
- the area between the first connection metallization is covered and the WSiN-layer is structured to a WSiN-residual layer as necessary for the construction component,
- a second passivating layer is deposited and openings for electrical connections are formed, preferably on the ends of the WSiN-residual layer,
- in these openings metal contacts are introduced, the part of the second passivating layer provided between the metal contacts is so designed or equipped, that an opening transmissive for electromagnetic rays results.

A particular advantage of the WSIN materials, which were previously not employed for these purposes, results from the characteristic, that even at higher TCRs, for example greater than 1%/° C., they have an extraordinarily low 1/f-noise.

A further advantage with this type of WSiN thermal resistor results from the ability to chemically deposit on almost all substrate materials. Thereby this material makes possible a simple and economical production of this type of construction component.

BRIEF DESCRIPTION OF THE DRAWINGS

In the following the invention will be described in greater detail on the basis of preferred embodiments with reference to schematic representations in the figures. There is shown.

DETAILED DESCRIPTION OF THE INVENTION

Figure 1:
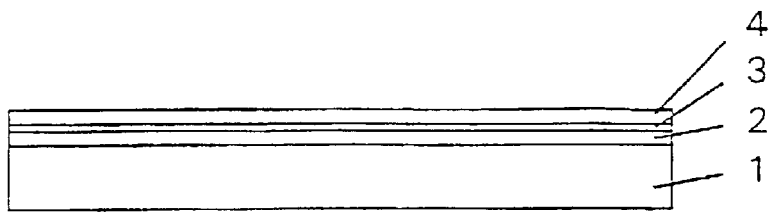
FIGS. 1a–h method of manufacture of a thermistor with a free standing layer in the radiation area, FIGS. 2a–d method of manufacturing a thermistor with a BCB-layer as insulation layer, FIGS. 3a–e method of manufacturing a thermistor with a polyimide mesastructure as insulation layer.
Figure 1:
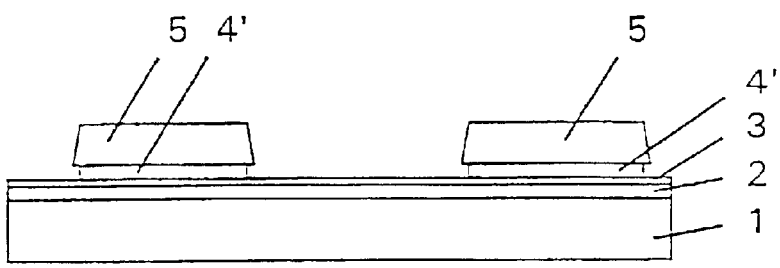
Figure 1:
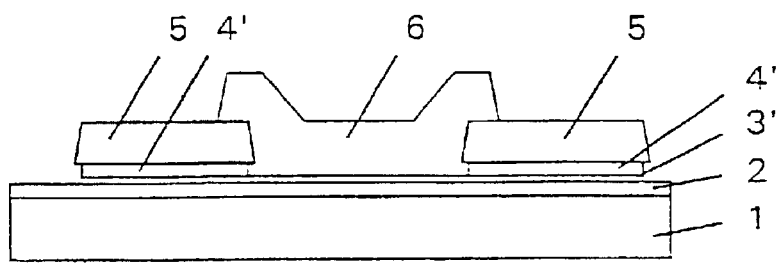
Figure 1:
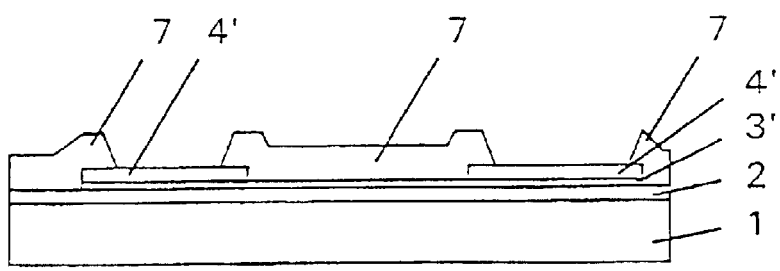
Figure 1:
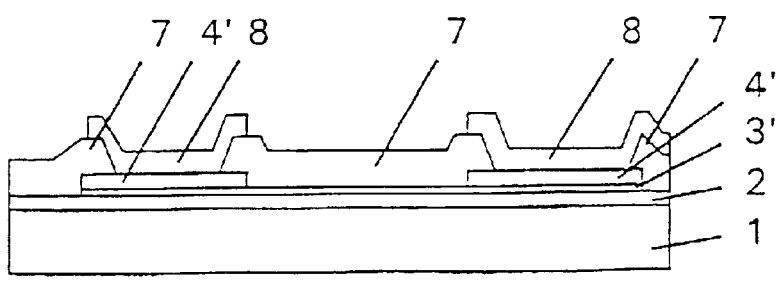
Figure 1:
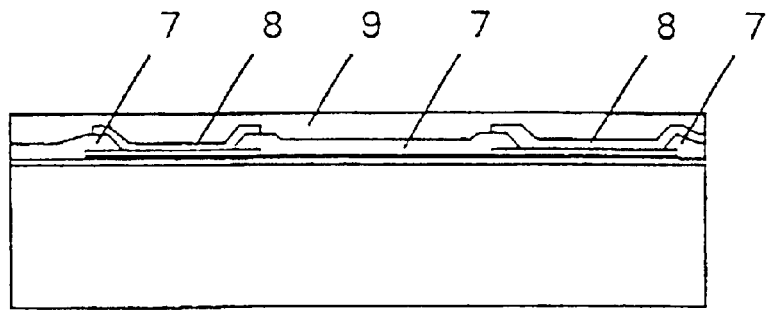
Figure 1:
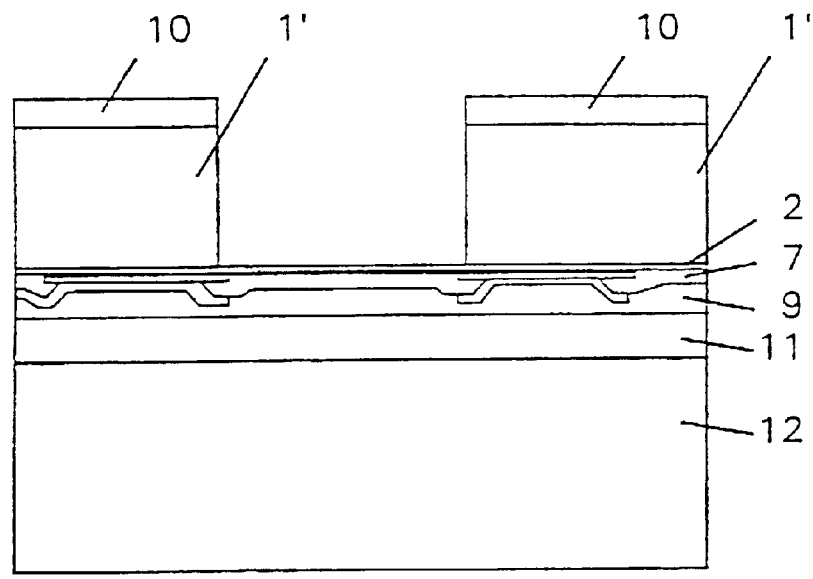
Figure 1:
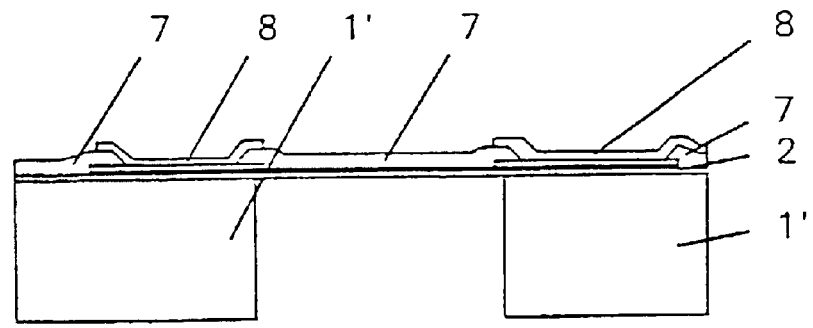

In one illustrative embodiment according to the FIG. 1 the process for manufacturing a thermistor with passive semiconductor construction element is described in detail. The process is comprised of the following process steps:

On a silicon substrate 1 approximately 400 µm thick, an approximately 2 µm thick oxide layer is deposited as first passivating layer 2, preferably via a CVD-process (Chemical Vapor Deposition). Upon this first passivating layer 2 a WSiN-layer 3 is deposited using the PVD-method (Physical Vapor Deposition) under defined addition of nitrogen gas during the deposition process. Depending upon the nitrogen content in the process gas the TCR-value and the mechanical layer characteristics can be intentionally influenced over a broad range. Using the same PVD-method a WTi/Al-layer as first metal layer 4 (FIG. 1a) is deposited or precipitated over the entire surface as cover layer.

In a further process the first metal layer 4 is structured into a first connection metallization, in that with a first mask 5 the areas not to be etched are covered, and by means of a wet chemical process the first metal layer 4 is eroded with the exception of the remaining residual as first connection metallization 4' (FIG. 1b).

The WSiN-layer 3 exposed to the surface following the etching process is then, in the area between the first connection metallization 4', covered by a further second mask 6. The WSiN is removed in the surrounding areas by RIE (Reactive Ion Etching). The WSiN-layer remaining under the mask 5 and 6 defines the active zone of the thermistor (FIG. 1c).

A further oxide layer as second passivating layer 7 is deposited with an approximate thickness of 400 nm. In the areas of the first connection metallization 4' openings for electrical connections are structured at the ends of the WSiN-residual layer 3' (FIG. 1d).

Metal contacts 8 of WTi/Au are introduced in these openings. The part of the second passivating layer 7 positioned between the metal contacts is so designed, that this represents an opening transmissive for electromagnetic radiation. In certain cases the passivating layer is thinned in the radiated area (FIG. 1e).

In further course of the process, for thermal decoupling, the substrate 1 is removed from the substrate bottom side up to the bottom side of the first passivating layer 2 in the area between the connection metallization 4'. For this the upper side is covered over with a third mask 9 (FIG. 1f).

With a fourth mask 10, of which the thickness is approximately 15 to 20 µm, the substrate back side is covered and in the areas of the active thermistor layer on the front side is opened for an etching process. Due to the relatively thick substrate 1 a high rate etching process is used for removing the substrate with the exception of the substrate residue 1' (FIG. 1g). The construction component with a free-standing active thermistor layer produced by this process is represented in FIG. 1h.

Figure 2:
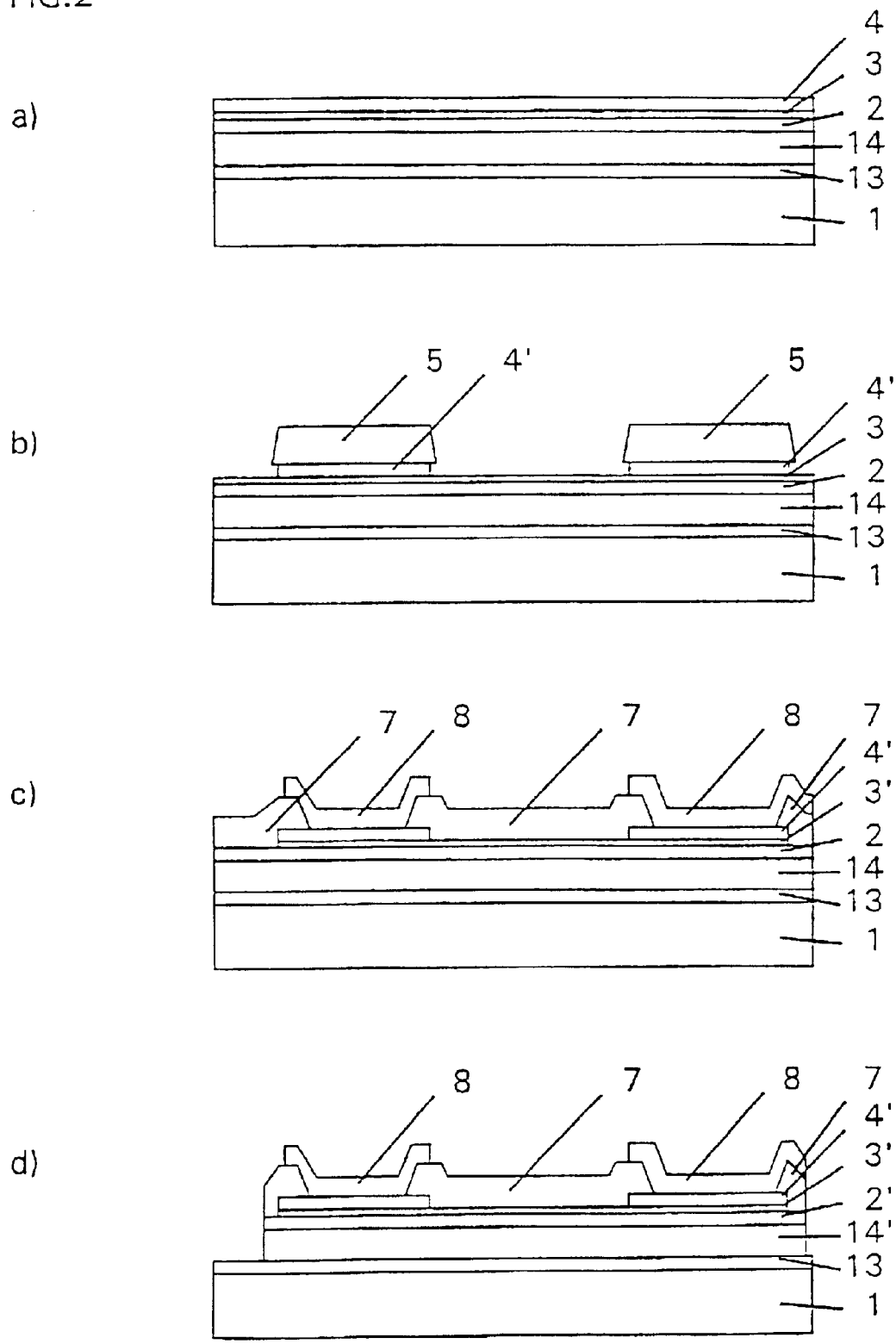

Alternatively, between the WSiN-residue layer 3' and the first connection metallization 4', an intermediate layer sequence 13, 14 or as the case may be 15 is etched and so structured that this provides thermal insulation to the substrate 1 (FIG. 1a). The intermediate layer sequence is comprised of a carrier layer 13 and a BCB-layer 14 or, as the case may be, a polyimide dummy layer 15 (FIG. 2d or as the case may be FIG. 3e). In this case the substrate 1 is not etched for thermal decoupling. The remaining process steps (FIGS. 2b, 2c; 3b and 3c) correspond essentially to the above described process steps.

In the case of the method represented in FIG. 2d the thermal decoupling of the substrate is due to the thickness of the BCB-layer. For reducing the thermal resistance, the layers following upon the BCB-layer 14 are etched back laterally on the surface of the active thermistor (thickness of the BCB-layer corresponds to approximately 25–75 µm).

Figure 3:
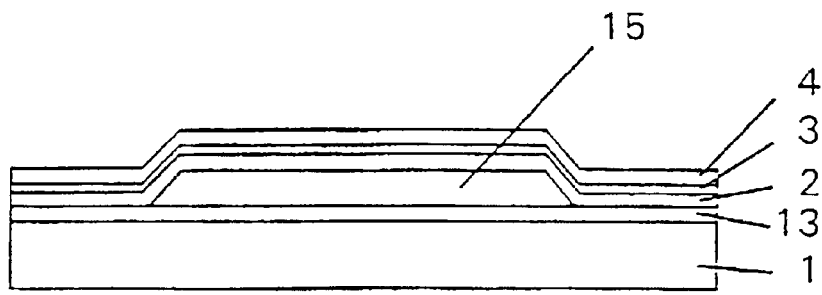
Figure 3:
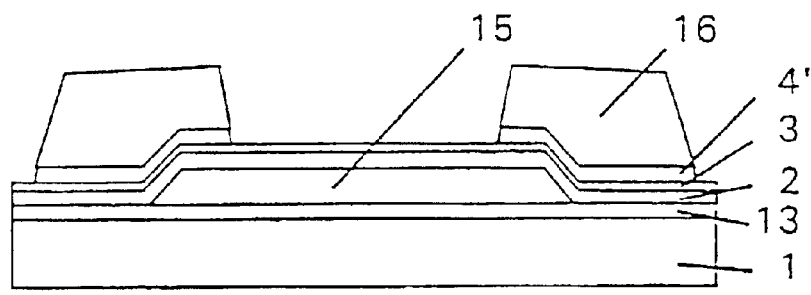
Figure 3:
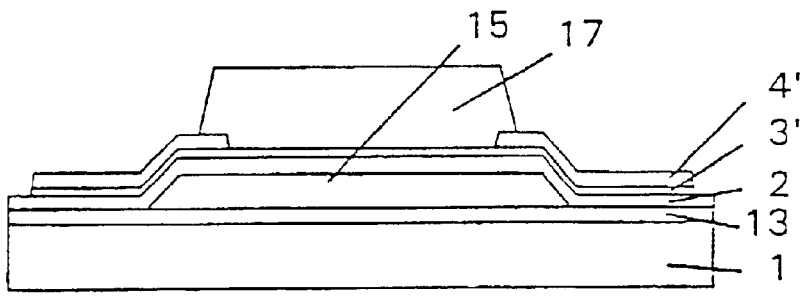
Figure 3:
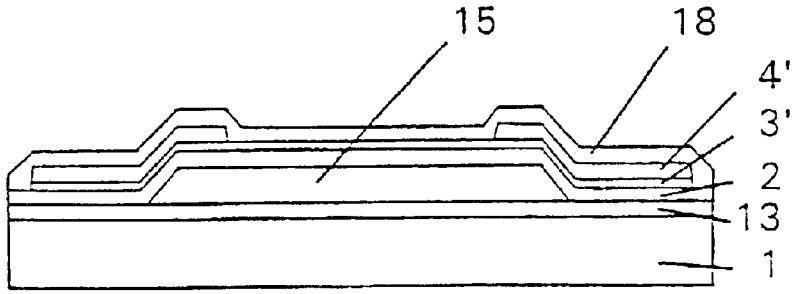
Figure 3:
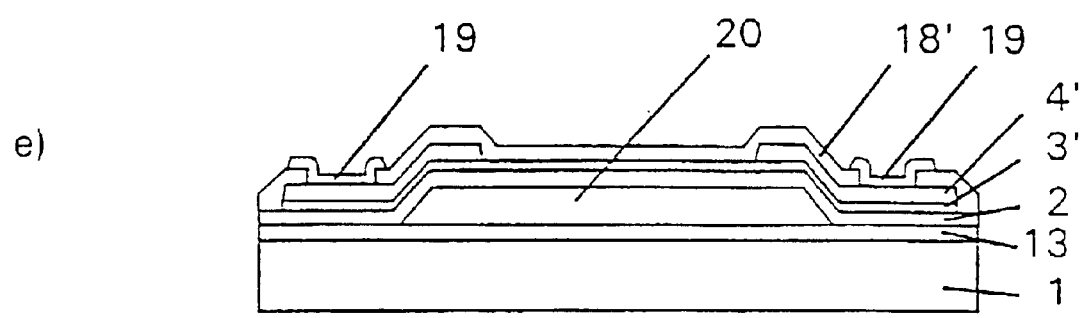

In the case of the method shown in FIG. 3, for example, one polyimide layer formed in an earlier stage of production is provided laterally upon the later-formed thermistor structure (FIG. 3a) and the thermistor is thereafter produced (FIG. 3e) upon this mesostructure analogously to the already described process steps according to FIGS. 3b, 3c and 3d. Finally the polyimide layer 15 is removed in an oxygen plasma process by means of an isotropic etching process. The empty space 20 resulting below the thermistor results in a thermal decoupling with respect to the substrate.

What is claimed is:

1. A layer sequence for a thin film resistor with high thermal coefficient on a substrate, comprising:

a first passivating layer (2), a WSiN-layer (3), and a first metal layer (4), wherein the the chemical composition of the WSiN-layer is $W_xSi_yN_z$ with x, y as main components and with the proportion of z limited to a sufficiently low level that the temperature coefficient of resistance is greater than 1%/° C. and 1/f-noise is low, and wherein said resistor exhibits absorption in the infrared radiation range.

2. A layer sequence according to claim 1, wherein between the first passivating layer (2) and the WSiN-layer (3) an intermediate layer sequence (13, 14, 15) is provided for thermal insulation.

3. A layer sequence according to claim 2, wherein the intermediate layer sequence includes a BCB-layer (15).

4. A passive semiconductor component, comprising:

a substrate (1), a first passivating layer (2), a WSiN-residue layer (3'), a first connection metallization (4'), a second passivating layer (7) with openings for electrical connection at both ends of the resistor layer, metal contacts (8) at the sites of the openings provided in the second passivating layer, and a further electromagnetic radiation transmissive opening provided between the metal contacts (8), for radiation of the WSiN-residue layer (3'), wherein the the chemical composition of the WSiN-layer is $W_XSi_YN_Z$ with x, y as main components and with the proportion of z limited to a sufficiently low level that the temperature coefficient of resistance is greater than 1%/° C. and 1/f-noise is low, and wherein said resistor exhibits absorption in the infrared radiation range.

5. A passive semiconductor component, comprising:

a substrate (1), a first passivating layer (2), a WSiN-residue layer (3'), an intermediate layer sequence (13, 14, 15) for thermal insulation, a first connection metallization (4'), a second passivating layer (7) with openings for electrical connection at both ends of the WSiN-residue layer (3'), metal contacts (8) at the sites of the openings provided between the two passivating layers, and a further electromagnetic radiation transmissive opening provided between the metal contacts (8) for radiation of the WSiN-residue layer (3'), wherein the the chemical composition of the WSiN-layer is $W_XSi_YN_Z$ with x, y as main components and with the proportion of z limited to a sufficiently low level that the temperature coefficient of resistance is greater than 1%/° C. and 1/f-noise is low, and wherein said resistor exhibits absorption in the infrared radiation range.

6. A passive semiconductor component according to claim 5, wherein the intermediate layer sequence (13, 14, 15) for thermal insulation is provided locally in the area affected by radiation.

7. A passive semiconductor component comprising:

a substrate (1), a first passivating layer (2), a WSiN-residue layer (3'), an intermediate layer sequence (13, 14, 15) for thermal insulation, a first connection metallization (4'), a second passivating layer (7) with openings for electrical connection at both ends of the WSiN-residue layer (3'), metal contacts (8) at the sites of the openings provided between the two passivating layers, and a further electromagnetic radiation transmissive opening provided between the metal contacts (8) for radiation of the WSiN-residue layer (3'), wherein the intermediate layer sequence (13, 14, 15) for thermal insulation is provided locally in the area affected by radiation, and wherein the intermediate layer sequence (13, 14, 15) for thermal insulation includes a polyimide layer (15), which is removed by means of an oxide plasma, whereby at this area a thermal insulating void (20) results.

8. A passive semiconductor component according to claim 4, wherein the substrate (1) is comprised of silicon or glass.

9. A passive semiconductor component according to claim 1, wherein the first passivating layer (2) is an oxide layer with a thickness of approximately 2 $\mu$m.

10. A passive semiconductor component according to claim 1, wherein the opening transmissive for electromagnetic radiation, for radiation of the WSiN-residue layer (3'), is covered over with a second passivating layer (7), which is transmissive for infrared radiation.

11. A passive semiconductor component according to claim 1, wherein to form an opening the substrate (1) is removed up to the first passivating layer (2), for thermal decoupling.

12. A process for producing a passive semiconductor component, comprising, depositing a first passivating layer (2) on a substrate (1), depositing a WSiN-layer (3) and a first metal layer (4) over the entire surface on the first passivating layer (2), structuring the first metal layer (4) using a first mask (5) into a first connection metallization (4'), covering the area between the first connection metallization (4') by means of a second mask (6) and structuring the WSiN-layer (3) to a WSiN-residue layer (3') necessary for the construction component, depositing a second passivating layer (7), in which openings for electrical connections are structured optionally at the ends of the WSiN-residue layer (3') as resistance layer, introducing metal contacts (8) in these openings, structuring the part of the second passivating layer (7) provided between the metal contact (8) such that this includes an opening transmissive for electromagnetic radiation.

13. A process according to claim 12, wherein the substrate (1) is etched or removed in the area between the connection metallization (4') for thermal decoupling of the substrate bottom side up to the lower side of the first passivating layer (2).

14. A process according to claim 12, wherein between the WSiN-residue layer (3') and the first connectional metallization (4') a intermediate layer sequence (13, 14, 15) is deposited and so structured, that this provides a thermal insulation with respect to the substrate.

15. A process according to claim 14, wherein the intermediate layer sequence is comprised of a contact layer (13) and a BCB-layer (14) or a polyimide layer (15), structured in such a manner, that this provides insulation in the area of the thermal input towards the substrate (1).

16. A bolometer comprising, as thermistor, a passive semiconductor component comprising a thin film resistor with high thermal coefficient on a substrate comprising a first passivating layer (2), a WSiN-layer (3), and a first metal layer (4), wherein the the chemical composition of the WSiN-layer is $W_XSi_YN_Z$ with x, y as main components and with the proportion of z limited to a sufficiently low level that the temperature coefficient of resistance is greater than 1%/° C. and 1/f-noise is low, and wherein said resistor exhibits absorption in the infrared radiation range.

* * * * *